US007608942B2

(12) United States Patent
Chun et al.

(10) Patent No.: US 7,608,942 B2
(45) Date of Patent: Oct. 27, 2009

(54) POWER MANAGEMENT SYSTEM

(75) Inventors: Christopher K. Y. Chun, Austin, TX (US); Cornelis H. Voorwinden, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 294 days.

(21) Appl. No.: 10/542,669

(22) PCT Filed: Jan. 17, 2003

(86) PCT No.: PCT/EP03/00435

§ 371 (c)(1), (2), (4) Date: Jul. 18, 2005

(87) PCT Pub. No.: WO2004/066050

PCT Pub. Date: Aug. 5, 2004

(65) Prior Publication Data

US 2006/0139827 A1 Jun. 29, 2006

(51) Int. Cl.
*H02J 1/00* (2006.01)
*H02M 3/02* (2006.01)
*H05K 1/02* (2006.01)

(52) U.S. Cl. ............................. 307/39; 307/24; 307/29; 307/42

(58) Field of Classification Search ................... 307/24, 307/29, 39, 42
See application file for complete search history.

(56) References Cited

U.S. PATENT DOCUMENTS 5,675,480 A 10/1997 Stanford
5,748,033 A 5/1998 Kaveh et al.
6,040,718 A * 3/2000 Henry ......................... 327/71
6,121,786 A 9/2000 Yamagami et al.
6,172,884 B1 1/2001 Lanni
6,265,855 B1 * 7/2001 Aas et al. .................... 323/272

(Continued)

FOREIGN PATENT DOCUMENTS

EP 1081572 A1 3/2001

(Continued)

OTHER PUBLICATIONS

Ali et al, "A Fast Response, Programmable PA Regulator Subsystem for Dual Mode CDMA/AMPS Handsets" Radio Frequency Integrated Circuits Symposium, 2000 IEEE, 2000, pp. 231-234.

*Primary Examiner*—Albert W Paladini
*Assistant Examiner*—Hal I Kaplan
(74) *Attorney, Agent, or Firm*—David G. Dolezal; Joanna G. Chiu

(57) ABSTRACT

An integrated circuit (103) having a plurality of integrated circuit portions (111, 113, and 115) where each of the plurality of integrated circuit portions receives a corresponding voltage of a plurality of voltages. Selection circuitry (127 and 123) selects a selected voltage of the plurality of voltages and provides an indication of the selected voltage to adjust the supply voltage to the integrated circuit. in one embodiment, the indication may correspond to an analog signal proportional to the selected voltage such as e.g. at the selected voltage or at a voltage less than or greater than the selected voltage. A power supply system (105), coupled to the integrated circuit, may be used to receive the indication of the selected voltage and adjust the supply voltage based on the indication.

29 Claims, 2 Drawing Sheets

U.S. PATENT DOCUMENTS

| | | | | |
|---|---|---|---|---|
| 6,472,898 | B1 * | 10/2002 | Hollmer et al. | 324/765 |
| 6,566,935 | B1 | 5/2003 | Renous | |
| 6,720,896 | B2 * | 4/2004 | Semmler et al. | 341/120 |
| 6,737,838 | B2 * | 5/2004 | Sluijs et al. | 323/225 |
| 6,819,088 | B2 * | 11/2004 | Shenai et al. | 323/222 |
| 6,995,599 | B2 * | 2/2006 | Huang et al. | 327/408 |

FOREIGN PATENT DOCUMENTS

| | | |
|---|---|---|
| JP | 06-139373 | 5/1994 |
| JP | 2001-284530 | 10/2001 |
| JP | 2002-111470 | 4/2002 |

* cited by examiner

POWER MANAGEMENT SYSTEM

BACKGROUND OF THE INVENTION

1. Field of the Invention

This invention relates in general to integrated circuits and in particular a power management system for an integrated circuit.

2. Description of the Related Art

Integrated circuits utilize power for operation. With some integrated circuits, different circuit portions of the integrated circuit have different voltage requirements for operation. For example, different circuit portions of an integrated circuit may be powered at different voltage levels. With some of these integrated circuits, it may be desirable during operation to change the voltages of the power being supplied to each of the different circuit portions to increase the overall power efficiency of the integrated circuit and/or to decrease the thermal output of the integrated circuit.

With some systems, it may be desirable to reduce the difference between the voltage of the power supplied to the integrated circuit and the voltages supplied to the different circuit portions of the integrated circuit to increase the power efficiency of the integrated circuit. However, because the voltages supplied to the different circuit portions may be changed during operation, the voltage of the power supply to the integrated circuit has to be high enough to meet the maximum possible voltage supplied to any one of the different circuit portions. Accordingly, meeting this maximum voltage requirement may decrease the power efficiency of an integrated circuit.

What is desired is a power management system for an electronic system with an improved power efficiency.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
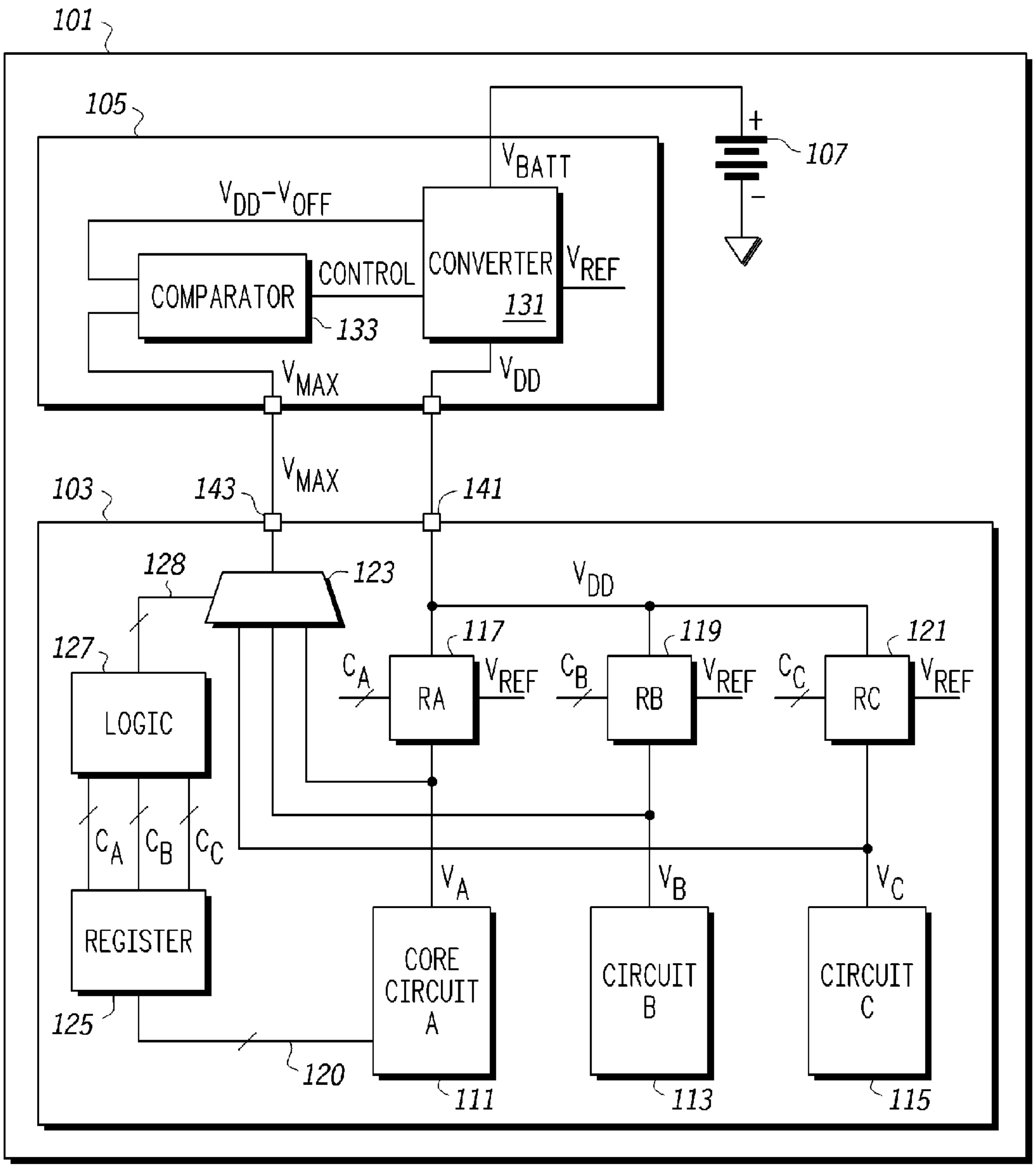
FIG. 1 is a block diagram of an embodiment of an electronic system according to the present invention.

FIG. 1 is a block diagram of an electronic system according to the present invention. Electronic system 101 includes an integrated circuit 103 for performing operations of the electronic system. In one embodiment, system 101 is a hand held cellular telephone and integrated circuit 103 is a base band ICU (integrated circuit unit) chip which includes modern circuitry such as a digital signal processor (DSP) and a micro controller unit (MCU). In other embodiments, electronic system 101 is a computer system such as e.g. a personal digital assistant (PDA) or laptop computer where integrated circuit 103 is a central processing unit chip. In one embodiment, integrated circuit 103 implements CMOS technology.

As shown in FIG. 1, integrated circuit 103 includes three integrated circuit portions that are each individually supplied with power at a regulated voltage from a voltage regulator of the integrated circuit. Integrated circuit portion A 111 receives power from regulator A 117 at a voltage VA, integrated circuit portion B 113 receives power from regulator B 119 at a voltage VB, and integrated circuit portion C 115 receives power from regulator C 121 at a voltage VC. In the embodiment shown, integrated circuit portion A 111 is the core processing unit of integrated circuit 103. In one embodiment, each of the circuit portions (111, 113, and 115) represents an independent voltage-frequency segment. In one embodiment, circuit portion A 111 includes an MCU, circuit portion B 113 includes a DSP, and circuit portion C 115 includes a memory.

Integrated circuit 103 receives operating power at a supply voltage (VDD) from a power supply system 105 via pin 141. In other embodiments, the power supply input of integrated circuit 103 may include multiple pins connected together internally in integrated circuit 103. As will be discussed later, integrated circuit 103 includes circuitry for selecting a voltage from one of VA, VB, and VC and providing an indication of that voltage as an output to power supply system 105 to adjust the voltage of VDD.

Regulators 117, 119, and 121 each receive power from the power supply system 105 via pin 141 and converts the power at voltage VDD to the desired output voltage (VA, VB, or VC) for its respective circuit portion (circuit portion A, circuit portion B, and circuit portion C). Regulators 117, 119, and 121, each include an input for receiving a control signal (CA, CB, and CC) from register 125 for setting the voltage of the regulator output. Control signals CA, CB, and CC are voltage level indicators that indicate a desired output voltage for the regulator receiving the control signal. The output voltage (VA, VB, and VC) of each regulator (117, 119, and 121) is set by the voltage indicated by the control signal (CA, CB, or CC) received by the regulator. In some embodiment, regulators 117, 119, and 121 are linear regulators. In other embodiments, blocks 117, 119, and 121 may be implemented with switching devices such as e.g. a MOSFET.

Core circuit portion A 111 is able to individually adjust the voltage (VA, VB, or VC) of the output of regulators 117, 119, and 121, by writing a control value to register 125 via bus 120 during the operation of integrated circuit 103. Accordingly, core circuit portion A 111 is able to control the voltage of the power supplied to circuit portions 111, 113, and 115 in order to increase the power efficiency of integrated circuit 103. In one embodiment, register 125 is part of core circuit portion A 111.

Integrated circuit 103 includes circuitry for selecting a voltage from one of VA, VB, and VC and providing an indication of that voltage as an output to power supply system 105 to adjust the voltage of VDD. In the embodiment of FIG. 1, logic circuit 127 receives the control signals CA, CB, and CC from register 125 and, based on those control signals, provides a mux control signal 128 at a particular state to multiplexer 123. Each of the outputs of regulators 117, 119, and 121 are inputs to multiplexer 123. Based upon the state of mux control signal 128, multiplexer 123 provides one of the output voltages of regulators 117, 119, or 121 at its output to power supply system 105 via pin 143.

In one embodiment, logic circuit 127 selects the regulator output voltage (VA, VB, or VC) of regulators 117, 119, and 121 that is provided to power supply system 105 based on which regulator output voltage is the highest voltage of the three, as indicated by control signals CA, CB, and CC. For example, if control signal CA indicates 1.0V, control signal GB indicates 0.8 volts, and control signal CC indicates 1.2 volts, logic circuit 127 would place mux control signal 128 in a state to control multiplexer 123 to provide the voltage VC of the output of regulator 121 to power supply system 105, which in FIG. 1 is indicated as "Vmax."

In the embodiment shown, power supply system 105 utilizes Vmax to adjust the voltage VDD to a level that is just high enough to meet the requirements of the highest voltage of VA, VB, or VC, as indicated by control signals CA, CB, and CC. Power supply system 105 makes VDD an offset voltage (Voff) greater than the voltage of Vmax (which is the highest of VA, VB, or VC). In one example, if Vmax is equal to 1.0 V and Voff is 0.4, then VDD is equal 1.4. In one embodiment, Voff corresponds to the maximum of the minimum voltage drop across any of the regulators 117, 119, and 121. The minimum voltage drop across a regulator is the smallest voltage drop between its input (VDD) and its output (VA, VB, VC) where the regulator is still operational. With some linear regulators, the minimum voltage drop may range as low as a few hundred millivolts.

Providing a power supply voltage (e.g. VDD) that is just high enough to meet the input voltage requirements of the regulator of an integrated circuit programmed to provide the maximum voltage may enable a system to provide the lowest possible VDD to an integrated circuit even if the voltage requirements of portions of the integrated circuit change during the operation of the integrated circuit. With some embodiments, Voff may be sized to account for other voltage drops or other operating considerations of system 101. Providing the lowest possible VDD during the operation of an integrated circuit may enable system 101 to operate with increased power efficiency.

Furthermore, providing an indication of the selected voltage supplied to an integrated circuit portion, to a power supply system may provide a more accurate, real time feedback of the voltage being supplied to the circuit portions for the adjustment of the supply voltage (VDD).

Power supply system 105 includes a converter 131 for converting the power from battery 107 (which is at voltage Vbatt) to a regulated power at VDD. In one embodiment converter 131 includes a switching regulator having a buck configuration. Converter 131 has an output to provide a voltage equal to VDD-Voff to an input of comparator 133. A second input of comparator 133 receives Vmax. Comparator 133 provides at its output a control signal (Control) to converter 131 to adjust VDD based upon the comparison of VDD-Voff versus Vmax. In one embodiment, the output of comparator 133 is a discrete signal that is at a high voltage if VDD-Voff is greater than Vmax and a low voltage if Vmax is greater than VDD-Voff.

In one embodiment, the value of Voff is hardwired in converter 131. In other embodiments, Voff could be programmable, either during the assembly of system 101 or in some embodiments, during the operation of system 101 via a programming input (not shown) of converter 131. In the embodiment shown, power supply system 105 is implemented as an integrated circuit. However, in other embodiments, power supply system 105 would be implemented in separate components. With other embodiments, power supply system 105 may include other regulators (not shown) and power management circuitry (not shown) for providing power to other circuitry (not shown) of system 101 as well as include circuitry (not shown) unrelated to power management. Also in other embodiments, power supply system 105 may be configured to receive power from other power source types such as e.g. AC power or solar power.

Figure 2:
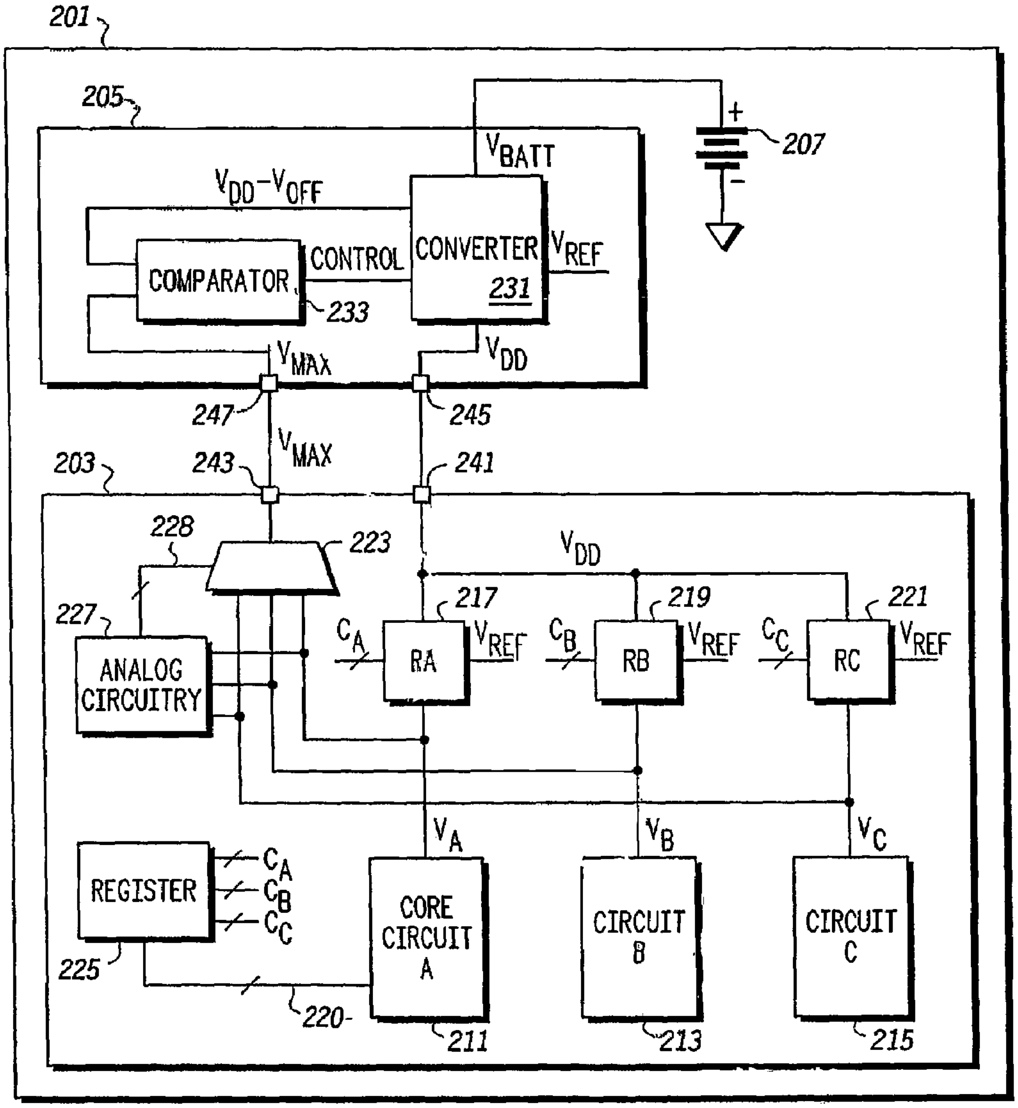
FIG. 2 is a block diagram of another embodiment of an electronic system according to the present invention.

FIG. 2 shows another embodiment of a electronic system according to the present invention. Electronic system 201 is similar electronic system 101 of FIG. 1 except that the selection of the regulator output voltage (VA, VB, or VC) provided by multiplexer 223 to power supply system 205 is based on the sensed voltages (VA, VB, VC) of the outputs of the regulators (217, 219, and 221). In FIG. 2, analog circuitry 227 includes inputs connected to the outputs of regulators 217, 219, or 221. Based upon the voltages sensed at the outputs of regulators 217, 219, and 221, analog circuitry 227 places mux control signal 228 in a state to select one of the output voltages of regulators 217, 219 or 221 to provide at the output of multiplexer 223 to power supply system 205. In the embodiment, shown, analog circuitry 227 senses which one of VA, VB, or VC is the highest voltage and places multiplexer 223 in a state to provide the highest voltage of VA, VB, or VC to power supply system 205 as Vmax.

Those of skill in the art will recognize that, based upon the teachings herein, several modifications may be made to the embodiments shown in FIGS. 1-2 and described herein. For example, although the voltage (Vmax) provided to the power supply system (105 and 205) is an analog signal in FIGS. 1 and 2, the systems of FIGS. 1 and 2 may be modified to provide a digital signal of the voltage of the selected output voltage of regulators 117, 119, and 121. For example, in FIG. 1, an analog to digital converter could be located at the output of multiplexer 123. In another embodiment, Vmax may be at a voltage that is proportional to and is less than or greater than the voltage of the selected output voltage of regulators 117, 119, and 121. Other embodiments may include circuitry for selecting from a number of voltages other than three (e.g. 2 or more than 3) as shown in FIG. 1 and FIG. 2.

In one aspect of the invention, an integrated circuit includes an input to receive power at a supply voltage and a plurality of integrated circuit portions each receiving a corresponding voltage of a plurality of voltages. The integrated circuit also includes selection circuitry that selects a selected one of the plurality of voltages and provides an indication of the selected one of the plurality of voltages to adjust the supply voltage.

In another aspect of the invention, an electronic system includes an integrated circuit having an input to receive power at a supply voltage, a plurality of integrated circuit portions each receiving a corresponding voltage of a plurality of voltages, and selection circuitry that selects a selected one of the plurality of voltages and provides an indication of the selected one of the plurality of voltages. The electronic system also includes a power supply system coupled to the integrated circuit. The power supply system adjusts the supply voltage based on the indication of the selected one of the plurality of voltages provided by the selection circuitry.

In another aspect of the invention, a method for managing power in an electronic system includes powering an integrated circuit at a supply voltage and providing a corresponding voltage of a plurality of voltages to each integrated circuit portion of a plurality of integrated circuit portions of the integrated circuit. The method also includes selecting a selected one of the plurality of voltages and using the selected one of the plurality of voltages to adjust the supply voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit, comprising:

an input to receive power at an input voltage;

a plurality of integrated circuit portions each receiving a corresponding voltage of a plurality of voltages; and selection circuitry that selects a selected one of the plurality of voltages and provides an indication of the selected one of the plurality of voltages to adjust the input voltage.

2. The integrated circuit of claim 1, wherein the selection circuitry selects the selected one of the plurality of voltages based on sensing at least a portion of the plurality of voltages, wherein the selected one of the plurality of voltages corresponds to a maximum voltage sensed from the portion of the plurality of voltages.

3. The integrated circuit of claim 1, further comprising:

storage circuitry that stores a plurality of voltage level indicators which set each of the plurality of voltages, and wherein the selection circuitry selects the selected one of the plurality of voltages based on the plurality of voltage level indicators.

4. The integrated circuit of claim 3, wherein the selection circuitry determines which one of the plurality of voltage level indicators indicates a maximum voltage of the plurality of voltages, and wherein the selected one of the plurality of voltages corresponds to the one of the plurality of voltage level indicators that indicates the maximum voltage.

5. The integrated circuit of claim 1 ,further comprising:

a plurality of voltage regulators, each having an input to receive the input voltage and an output to provide a corresponding one of the plurality of voltages.

6. The integrated circuit of claim 5, wherein each of the plurality of voltage regulators has a voltage drop, and the input voltage is adjusted based on the voltage drop and the selected one of the plurality of voltages.

7. The integrated circuit of claim 1, wherein the selected one of the plurality of voltages corresponds to a maximum voltage of the plurality of voltages.

8. The integrated circuit of claim 1, further comprising:

a plurality of switching devices, each having a first current electrode coupled to receive the input voltage and a second current electrode coupled to provide a corresponding one of the plurality of voltages.

9. The integrated circuit of claim 1, wherein the indication of the selected one of the plurality of voltages is provided to a power supply system, external to the integrated circuit, the power supply system adjusting the input voltage based on the indication of the selected one of the plurality of voltages.

10. The integrated circuit of claim 1, wherein the indication is an analog signal having a voltage proportional to the selected one of the plurality of voltages.

11. The integrated circuit of claim 1, further comprising:

multiplexer circuitry having a plurality of inputs for receiving the plurality of voltages and an output for providing the selected one of the plurality of voltages.

12. An electronic system, comprising:

an integrated circuit having an input to receive power at an input voltage, a plurality of integrated circuit portions each receiving a corresponding voltage of a plurality of voltages, and selection circuitry that selects a selected one of the plurality of voltages and provides an indication of the selected one of the plurality of voltages; and a power supply system coupled to the integrated circuit, wherein the power supply system adjusts the input voltage based on the indication of the selected one of the plurality of voltages provided by the selection circuitry.

13. The electronic system of claim 12, wherein the selection circuitry selects the selected one of the plurality of voltages based on sensing at least a portion of the plurality of voltages, wherein the selected one of the plurality of voltages corresponds to a maximum voltage sensed from the portion of the plurality of voltages.

14. The electronic system of claim 12, further comprising:

storage circuitry that stores a plurality of voltage level indicators which set each of the plurality of voltages, wherein the selection circuitry selects the selected one of the plurality of voltages based on the plurality of voltage level indicators.

15. The electronic system of claim 14, wherein the selection circuitry determines which one of the plurality of voltage level indicators indicates a maximum voltage of the plurality of voltages, and wherein the selected one of the plurality of voltages corresponds to the one of the plurality of voltage level indicators that indicates the maximum voltage.

16. The electronic system of claim 12, wherein the power supply system further comprises:

comparison circuitry that compares the indication of the selected one of the plurality of voltages to a reference voltage based on the input voltage and outputs a control signal; and a converter having an output to provide the input voltage, wherein the converter adjusts the input voltage based on the control signal.

17. A hand held electronic device comprising the electronic system of claim 12.

18. The electronic system of claim 12, wherein the indication of the selected one of the plurality of voltages is an analog signal at a voltage proportional to the selected one of the plurality of voltages.

19. The electronic system of claim 18 wherein the indication of the selected one of the plurality of voltages is the selected one of the plurality of voltages.

20. The electronic system of claim 19 wherein the voltage of the analog signal is at the selected one of the plurality of voltages.

21. A method for managing power in an electronic system, comprising:

powering an integrated circuit at an input voltage;

providing a corresponding voltage of a plurality of voltages to each integrated circuit portion of a plurality of integrated circuit portions of the integrated circuit;

selecting a selected one of the plurality of voltages; and using the selected one of the plurality of voltages to adjust the input voltage.

22. The method of claim 21, wherein the selected one of the plurality of voltages corresponds to a maximum voltage of the plurality of voltages.

23. The method of claim 21, wherein the selected one of the plurality of voltages corresponds to a voltage level indicator that indicates a maximum voltage of the plurality of voltages.

24. The method of claim 23, wherein the voltage level indicator is one of a plurality of voltage level indicators, and wherein each voltage level indicator sets a voltage of the plurality of voltages.

25. The method of claim 23, further comprising:

comparing the selected one of the plurality of voltages to a reference voltage based on the input voltage; and adjusting the input voltage in response to comparing.

26. The method of claim 21, wherein providing the corresponding voltage comprises powering each integrated circuit portion at the corresponding voltage.

27. The method of claim 21 wherein:

the powering the integrated circuit at an input voltage includes providing power to a plurality of voltage regulators of the integrated circuit;

the providing a corresponding voltage of the plurality of voltages includes each of the plurality of voltage regulators providing a corresponding voltage of the plurality of voltages.

28. The integrated circuit of claim 1, further comprising:

a plurality of voltage regulators, each having a regulator input to receive power supplied to the integrated circuit from the input and an output to provide a corresponding one of the plurality of voltages.

29. The electronic system of claim 12 wherein the integrated circuit further comprises:

a plurality of voltage regulators, each having a regulator input to receive power supplied to the integrated circuit from the input and an output to provide a corresponding one of the plurality of voltages.

* * * * *